United States Patent
Kamikoriyama et al.

(10) Patent No.: US 8,043,535 B2
(45) Date of Patent: Oct. 25, 2011

(54) CONDUCTIVE INK

(75) Inventors: Yoichi Kamikoriyama, Ageo (JP); Sumikazu Ogata, Ageo (JP); Kei Anai, Ageo (JP); Hiroki Sawamoto, Ageo (JP); Mikimasa Horiuchi, Ageo (JP); Takashi Mukuno, Shimonoseki (JP); Katsuhiko Yoshimaru, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 11/722,897

(22) PCT Filed: Dec. 26, 2005

(86) PCT No.: PCT/JP2005/023795
§ 371 (c)(1),
(2), (4) Date: Aug. 7, 2007

(87) PCT Pub. No.: WO2006/070747
PCT Pub. Date: Jul. 6, 2006

(65) Prior Publication Data
US 2008/0134936 A1  Jun. 12, 2008

(30) Foreign Application Priority Data

Dec. 27, 2004 (JP) ................. 2004-375893
Feb. 24, 2005 (JP) ................. 2005-048662

(51) Int. Cl.
*H01B 1/02* (2006.01)
(52) U.S. Cl. ............. 252/513; 252/512; 252/520.2; 252/521.3; 106/31.92
(58) Field of Classification Search .......... 252/500, 252/512, 513, 520.2, 521.3; 106/31.92
See application file for complete search history.

(56) References Cited

U.S. PATENT DOCUMENTS

| 6,356,234 | B1 * | 3/2002 | Harrison et al. ....... 343/700 MS |
| 6,746,628 | B2 * | 6/2004 | Kamikoriyama et al. .... 252/513 |
| 6,780,772 | B2 * | 8/2004 | Uzoh et al. .................... 438/690 |
| 2003/0001142 | A1 * | 1/2003 | Kamikoriyama et al. .... 252/500 |
| 2003/0146019 | A1 | 8/2003 | Hirai |
| 2005/0069648 | A1 * | 3/2005 | Maruyama .................... 427/379 |
| 2005/0215689 | A1 * | 9/2005 | Garbar et al. ................. 524/440 |

FOREIGN PATENT DOCUMENTS

| JP | 8018190 | | 1/1996 |
| JP | 9246688 | | 9/1997 |
| JP | 2002317201 | A | 10/2002 |
| JP | 2002324966 | A | 11/2002 |
| JP | 2002334618 | | 11/2002 |
| JP | 2004/87183 | A | 3/2004 |
| WO | WO03/051562 | * | 6/2003 |
| WO | WO03106573 | A1 * | 12/2003 |
| WO | WO 2004/005413 | A1 | 1/2004 |
| WO | WO2008018718 | A1 * | 2/2008 |

* cited by examiner

*Primary Examiner* — Mark Kopec
*Assistant Examiner* — Haidung Nguyen
(74) *Attorney, Agent, or Firm* — Greenblum & Bernstein, PLC

(57) ABSTRACT

It is an object of the present invention to provide a conductive ink which enables to form a circuit or the like having excellent adhesion to a substrate and to form a conductor having high film density and low electric resistance. In order to attain the object, a conductive ink comprising metal powder or metal oxide powder dispersed in a dispersion medium, which is characterized in that the dispersion medium contains a metal salt or a metal oxide as a film density improver for increasing film density of a conductor formed by using the conductive ink is adopted. A main solvent constituting the dispersion medium is selected from one or a combination of two or more selected from the group consisting of water, alcohols, glycols and saturated hydrocarbons having a boiling point of 300 deg. C. or less at normal pressure.

1 Claim, 4 Drawing Sheets

US 8,043,535 B2

CONDUCTIVE INK

CROSS REFERENCE TO RELATED APPLICATION

This application is a 35 USC §371 National Phase Entry Application from PCT/JP2005/023795, filed Dec. 26, 2005, and designating the United States. This application claims priority under 35 U.S.C. §119 based on Japanese Patent Application Nos. JP2004-375893 filed Dec. 27, 2004, and JP2005-048662 filed Feb. 24, 2005, which are incorporated herein in their entirety.

TECHNICAL FIELD

The present invention relates to a conductive ink and a method for producing the same. In particular, the present invention relates to a conductive ink applicable to form a circuit on a substrate by drawing a circuit shape or the like by using, for example, inkjet method or the like followed by curing.

BACKGROUND ART

As methods for forming a circuit pattern on various substrates, a method which uses etching method with photolithography and a screen printing method have been conventionally applied as disclosed in Patent Documents 1 and 2. In these conventional methods, a method for subjecting a copper foil of a copper clad laminate to etching processing to form a circuit pattern, and a method for directly forming wiring and an electrode pattern on the surface of a substrate by screen printing using a conductive paste which is made to be paste by kneading metal powder with a solvent and a resin have been widely applied.

A method to directly form a circuit on the surface of the substrate by using a technique such as a screen printing method after processing metal powder into a paste (hereinafter, merely referred to as "conductive paste") or an ink (hereinafter, merely referred to as "conductive ink") have been widely spread. Because the method has fewer process steps than that of the etching method for subjecting the copper foil of the copper clad laminate to etching processing to form the circuit, and can reduce the production cost remarkably.

However, the formation of a finer circuit according to the demand of the miniaturization and weight reduction of electronic equipment or the like have been required for recent electric circuits. The largest problem in directly forming the circuit on the substrate using the conductive paste was in that it was difficult to form the fine circuit using the screen printing or the like. As disclosed in Patent Document 3, in recent years, the circuit formation by applying an inkjet technique that has been applied to a printer as a technique has been tried for forming the fine circuit using the conductive ink.

In recent years, a conductive circuit pattern in a flat display represented by a mobile information device and TV sets has been densified year after year. Examinations have been performed for wirings not only a region having a wiring width of 40 micron meter or less but also for a circuit pattern forming technique on a flexible resin substrate with low-temperature firing. The line width formed in conventionally used screen printing with no open circuit and excellent wiring shape is about 100 micron meter. However, it is difficult to substantially form the wiring finer than a line width of 40 micron meter or less. As a technique for forming a circuit pattern on various substrates with low-temperature firing, as shown in Patent Document 4, a silver ink containing silver nano particles has been examined.

On the other hand, a conductive ink prepared by mixing metal powder with a large quantity of organic solvents and resins has been proposed as an ultra fine circuit pattern formation material using a dispenser coating method and an inkjet printing method shown in Patent Document 3, adhesion strength to the various substrates depends on organic resins. So, minute cracks are easily generated by gas generation in the decomposition of organic resin contents in a reduction firing process using hydrogen and the nitrogen which are generally used for forming wiring and electrode having low resistance. Such a minute crack causes the low bulk density of the wiring or electrode, and as a result, it is difficult to form a circuit having low resistance.

On the other hand, Patent Document 5 discloses a conductive paste consist of an aqueous nickel slurry containing water, nickel fine powder on which an insoluble inorganic oxide is adhered to the particle surface of each fine nickel powder, a polyacrylic acid, an ester or a salt thereof, and organic group-substituted ammonium hydroxide, and a binder as a composition of a conductive ink. In the aqueous nickel slurry, nickel fine powder in a high concentration is dispersed stably without causing the reaggregation of the nickel fine powder. However, when the ultra fine circuit pattern is formed using the inkjet printing technique, the aqueous nickel slurry does not have a surface tension suitable for printing. Thereby, when the circuit is formed with continuous printing, the clogging of an ink is easily generated in a nozzle. Also, since a phenomenon in which the ink does not point at the target print position takes place, it was substantially difficult to form the circuit by continuous printing industrially. Since the ink does not contain a binder applying adhesion strength to the substrate, the adhesion strength to the substrate is substantially zero even if printing can be performed on the substrate by the arrangements of the printing process. Thereby, it was difficult to substantially form the circuit except for an application in which metal powder is sintered in high-temperature firing represented by the internal electrode production of a multilayered ceramic capacitor.

[Patent Document 1] Japanese Patent Laid-Open No. 9-246688
[Patent Document 2] Japanese Patent Laid-Open No. 8-18190
[Patent Document 3] Japanese Patent Laid-Open No. 2002-324966
[Patent Document 4] Japanese Patent Laid-Open No. 2002-334618
[Patent Document 5] Japanese Patent Laid-Open No. 2002-317201

DISCLOSURE OF THE INVENTION

However, a conductive ink for printing the ultra fine wiring and/or electrode on the substrate for forming a high density circuit pattern has been examined using the dispenser coating method or the inkjet printing method as described above. However, problems that the conductive ink itself hardly be used in the inkjet method or the adhesion strength of the conductive ink to the various substrates was extremely low were not solved.

On the other hand, even when the adhesion of the conductive ink to various substrates can be performed, the film density of the conductor circuit formed by using the conductive ink is low and the conductor resistance increase; thereby the heat generation increase in operation and it may shorten the life of the substrate. The low density of the conductor means existing of many voids in the conductor, and the flatness of the conductor surface which is indispensable for realizing multilayer wiring can not be obtained. This is because the voids existing in the surface of the conductor may be dimple on the surface of the conductor. Furthermore, since the film density of the conductor is low, water and oxygen existing in the atmosphere is easily diffused into the conductor when it is used in an environment with high humidity. The metal powder forming the conductor may thereby be oxidized, and the diffusion of metal ions and particle growth may take place as a migration phenomenon to cause short circuit.

Therefore, the conductive ink used in the dispenser coating method or the inkjet method is required to prevent the clogging of a nozzle for ejecting ink, and for the purpose, reduction in the particle size of the metal particles contained in the conductive ink is required. Simultaneously, in order to achieve higher film density of the conductor, the character of the dispersion medium constituting the conductive ink also becomes important. It is considered that the conductive ink having good quality performance can be produced only by integrating these qualities, both the adhesion of the conductive ink to various substrates and the good film density of the formed conductor circuit.

From the above, it is an object of the present invention to provide a conductive ink capable of enhancing the adhesion of a circuit or the like formed by using a conductive ink to a substrate and increasing the film density of the formed conductor circuit to provide a low electric resistance. Also it is an object of the present invention to provide a conductive ink composition capable to form a circuit by printing ultra fine wiring and electrode on a substrate using an inkjet apparatus and a dispenser apparatus by using the fine metal powder having excellent dispersion as the metal powder contained in the conductive ink.

Then, the present inventors have conducted earnest studies to attain the above object, and have attained that if a conductive ink having following composition was used, the ink can provide a conductor circuit having high film density and a low electric resistance.

A conductive ink according to the present invention adopts a fundamental composition which is characterized in that the conductive ink comprises a metal powder or metal oxide powder dispersed in dispersion medium, wherein the dispersion medium contains a metal salt or a metal oxide as a film density improver to increase film density of a conductor formed by using the conductive ink.

A main solvent constituting the dispersion medium is preferably selected from one or a combination of two or more selected from the group consisting of water, alcohols, glycols and saturated hydrocarbons having a boiling point of 300 deg. C. or less at normal pressure.

In the conductive ink according to the present invention, the film density improver preferably contains one or two or more selected from a metal salt or metal oxide group containing Ti, V, Ni, Cu, Zn, Y, Zr, Nb, Mo, Ag, In, Sn, Ta and W.

The dispersion medium constituting the conductive ink according to the present invention preferably contains a dispersion auxiliary agent.

The dispersion auxiliary agent is preferably selected from one or a mixture of two or more selected from the group consisting of (a) a polyacrylic acid, an ester or a salt thereof, (b) an organic group-substituted ammonium hydroxide, and (c) a hydroxyl group-containing amine compound.

In the conductive ink according to the present invention, a surface tension of the dispersion medium is preferably adjusted from 15 mN/m to 50 mN/m by using a surface tension-adjusting agent.

The surface tension-adjusting agent is preferably selected from one or a combination of two or more selected from the group consisting of alcohol and glycol having a boiling point of 100 to 300 deg. C. at normal pressure.

The dispersion medium constituting the conductive ink according to the present invention preferably contains one or two or more selected from the group consisting of a silane coupling agent, a titanium coupling agent, a zirconia coupling agent and an aluminum coupling agent as an adhesion improver.

In the conductive ink according to the present invention, the metal powder or the metal oxide powder is preferably selected from one or mixed powder of two or more selected from nickel powder, silver powder, gold powder, platinum powder, copper powder, palladium powder and indium-tin oxide.

In the conductive ink according to the present invention, the nickel powder, one of the metal powders or metal oxide powder preferably has an average primary particle size of 100 nano meter or less.

Furthermore, in the conductive ink according to the present invention, the nickel powder has nickel particles preferably having an average primary particle size of 10 nano meter to 70 nano meter.

The conductive ink according to the present invention described above preferably has a viscosity of 60 cP or less at 25 deg. C.

ADVANTAGES OF THE INVENTION

The conductive ink according to the present invention is suitable for forming accurate and fine wiring and electrode by adopting a dispenser coating method and an inkjet printing method. The conductive ink according to the present invention has excellent adhesion to a glass substrate and a circuit or the like formed by elements of different kinds. Therefore, the conductive ink enables the formation of the wiring, electrode, protection electrode and protection film on a glass substrate, an ITO transparent electrode, the surface of a silver electrode and the surface of a copper electrode used for a TFT panel.

The conductive ink according to the present invention has large features in reduced electric resistance by increasing the density of the formed conductor circuit, enhanced adhesion described above and capability of the wiring formation in which surface flatness of the conductor is secured to enable the connection of metals of different kinds.

BEST MODE FOR CARRYING OUT THE INVENTION

Figure 1:
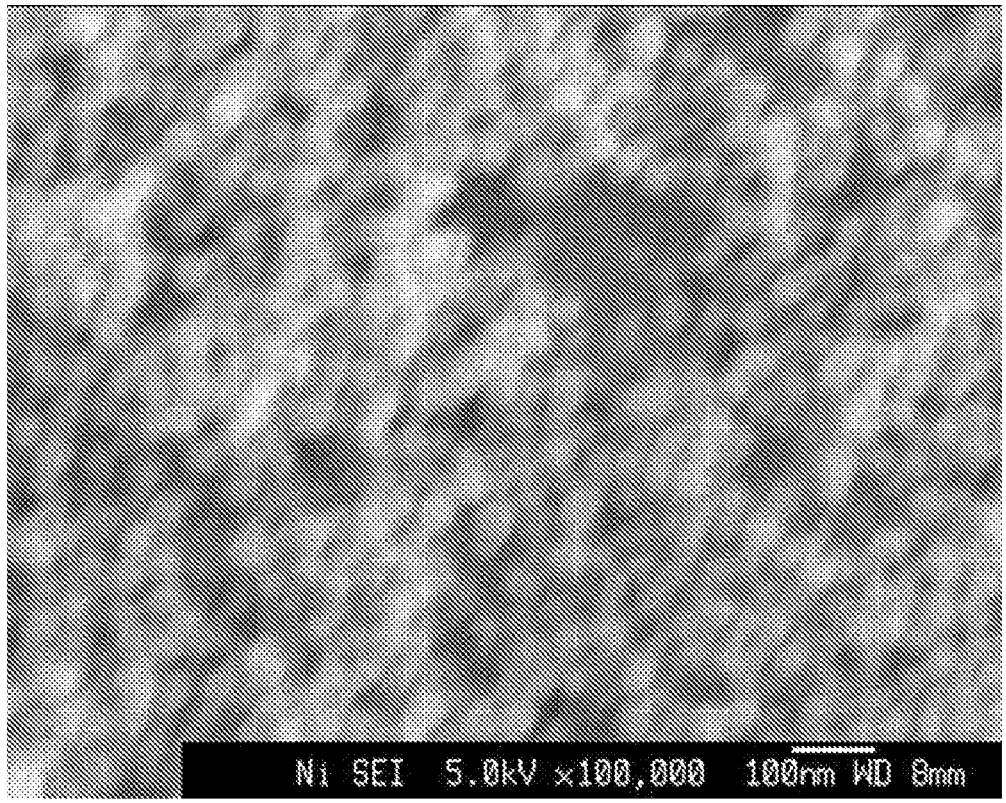
FIG. 1 shows a field emission scanning electron microscope image of fine nickel powder contained in a nickel slurry used for a conductive ink (nickel ink) according to the present invention.

<Conductive Ink According to the Present Invention>

As described above, a conductive ink according to the present invention adopts a fundamental composition in which the conductive ink comprises metal powder or metal oxide powder dispersed in a dispersion medium, which is characterized in that the dispersion medium contains metal salts or metal oxides as a film density improver. The film density improver increases the film density of a conductor formed by using the conductive ink to decrease the resistance in the operation.

Main Solvent:

As a main solvent for the dispersion medium in the conductive ink according to the present invention, water and an organic solvent or the like can be widely used. The main solvent is not particularly limited as long as the main solvent is compatible with the following film density improver and adhesion improver or the like and can be adjusted to a predetermined viscosity. Therefore, the main solvent is limited to one or a combination of two or more selected from the group consisting of water, alcohols and saturated hydrocarbons having a boiling point of 300 deg. C. or less at normal pressure.

Herein, the main solvent is limited to one having "boiling point of 300 deg. C. or less at normal pressure" according to the following reason. That is, in the boiling point temperature range exceeding 300 deg. C., a solvent gasifies in the forming process of an electrode in a reduction firing process at high temperature, and the gas generates minute cracks and voids in the electrode. Accordingly, a dense electrode cannot be formed and an electrode film cannot be accordingly densified, so not only high adhesion strength to various substrates cannot be exhibited, but also the electric resistance of the electrode film increase.

When water is used as the main solvent, the water has purity level of de-ionized water and distilled water or the like, and does not include water having a purity of tap water or the like.

For using the alcohols as the main solvent, it is preferable to use one or a combination of two or more selected from 1-propanol, 1-butanol, 1-pentanol, 1-hexanol, cyclohexanol, 1-heptanol, 1-octanol, 1-nonanol, 1-decanol, glycidol, benzyl alcohol, methylcyclohexanol, 2-methyl 1-butanol, 3-methyl-2-butanol, 4-methyl-2-pentanol, isopropyl alcohol, 2-ethylbutanol, 2-ethylhexanol, 2-octanol, terpineol, dihydroterpineol, 2-methoxyethanol, 2-ethoxyethanol, 2-n-butoxyethanol, 2-phenoxyethanol, carbitol, ethyl carbitol, n-butyl carbitol, and diacetone alcohol. Of these, alcohols having a boiling point of 80 deg. C. or higher at normal pressure and hardly evaporated at room temperature at normal pressure are preferable and 1-butanol, 1-octanol, terpineol, dihydroterpineol, 2-methoxyethanol, 2-ethoxyethanol, 2-n-butoxyethanol and diacetone alcohol are recommended.

For using the glycols as the main solvent, it is preferable to use one or a combination of two or more selected from ethylene glycol, diethyleneglycol, triethyleneglycol, tetraethylene glycol, propylene glycol, trimethylene glycol, dipropylene glycol, tripropylene glycol, 1,2-butylene glycol, 1,3-butylene glycol, 1,4-butylene glycol, pentamethylene glycol and hexylene glycol. Of these, the glycols with viscosities of 100 cP or less at normal temperature are more preferable and ethylene glycol, diethylene glycol, propylene glycol, 1,4-butylene glycol and dipropylene glycol are recommended. It is because if viscosity was too high, it is difficult to adjust viscosity to the level suitable for inkjet method.

For using the saturated hydrocarbons as the main solvent, it is preferable to use one or a combination of two or more selected from heptane, octane, nonane, decane, undecane, dodecane, tridecane, tetradecane, pentadecane and hexadecane. Of these, decane, undecane, dodecane, tridecane and tetradecane are recommended. It is because they have a boiling point of 300 deg. C. or less at normal pressure, and have a low vapor pressure to be hardly evaporated at room temperature and are easy in handling.

Film Density Improver:

In the conductive ink according to the present invention, the film density improver containing one or two or more selected from a metal salt or metal oxide group containing Ti, V, Ni, Cu, Zn, Y, Zr, Nb, Mo, Ag, In, Sn, Ta and W are recommended.

More specifically, as for Ti, titanium chloride, titanium sulfate tetrakis (diethylamino) titanium, and hexa fluoro ammonium titanate, titanium hydroxide, cresylic acid titanium and titanium dioxide are recommended. As for V, acetylacetonatovanadium and vanadium oxide acetylacetonate or the like are recommended. As for Ni, nickel oxide, nickel hydroxide, nickel acetate, nickel nitrate, nickel citrate, nickel oleate, nickel 2-ethylhexanoate and nickel naphthenate or the like are recommended. As for Cu, copper citrate, copper oleate, copper acetate, copper nitrate, copper gluconate, copper naphthenate, copper ethylacetoacetate, copper acetylacetonate, copper oxide, cuprous oxide and copper hydroxide or the like are recommended. As for Zn, zinc citrate, acetylacetonatozinc and zinc oxide or the like are recommended. As for Y, yttrium acetate and yttrium oxalate or the like are recommended. As for Zr, zirconium nitrate, acetylacetonatozirconium and zirconium oxide or the like are recommended. As for Nb, niobium oxide is recommended. As for Mo, ammonium thiomolybdate, molybdic acid, 12 molybdosilic acid and ammonium molybdate or the like are recommended. As for Ag, silver carbonate, silver acetate, silver nitrate, silver chlorate, silver perchlorate and silver oxide or the like are recommended. As for Indium, indium nitrate, indium chloride, indium hydroxide, indium 2-ethylhexanoate and tris (acetylacetonato) indium (III) or the like are recommended. As for Sn, tin chloride, tin-i-propoxide and tin-t-butoxide or the like are recommended. As for Ta, tantalum oxide is recommended. As for W, tungstic acid, ammonium tungstate, tungsten silicate, 12 tungsten silicate 26 water, tungsten oxide, copper tungstate and cerium tungstate or the like are recommended. To enhance the conductor density, at least one of the same metal salt or oxide thereof as the metal powder in the conductive ink is particularly recommended.

Since these metal salts or metal oxides themselves could be a metal form in the forming process of the conductor through the reduction firing process, they perform as a binder which firmly binds powder particles of the metal powder or oxide powder in the conductive ink with each other. The conductive ink which does not use these metal salts or oxides uses a large quantity of organics as a binder substance, so the organics are decomposed and gasified in the reduction firing process, and then the powder particles in the conductive ink as the object cannot be bond with each other. In addition, the generated gas causes a large quantity of minute cracks in the conductor, and it not only increase the electric resistance of the conductor but also decrease the density because of many of voids in the conductor and the surface flatness is not performed also.

Dispersion Auxiliary Agent:

The dispersion medium constituting the conductive ink according to the present invention preferably contains a dispersion auxiliary agent. This dispersion auxiliary agent prevents the reaggregation of the metal powder in the dispersion medium, and maintains the quality as the conductive ink over the long term.

As the dispersion auxiliary agent, adding one or a combination of two or more selected from any group of (a) a polyacrylic acid, an ester or a salt thereof, (b) organic group-substituted ammonium hydroxide, and (c) a hydroxyl group-containing amine compound is recommended.

Furthermore, in the case of the conductive ink according to the present invention, and particularly for nickel ink, the dispersion auxiliary agent is also preferably added, if necessary. As for dispersion auxiliary agent, adding one or two or more selected from any group of (a) a polyacrylic acid, an ester or a salt thereof, (b) organic group-substituted ammonium hydroxide, and (c) a hydroxyl group-containing amine compound is recommended.

For (a) a polyacrylic acid, an ester or a salt thereof used in the present invention, for example, polyacrylic acid, poly (methyl acrylate), sodium polyacrylate and ammonium polyacrylate can be introduced. Of these, ammonium polyacrylate is preferable since ammonium polyacrylate is easily adsorbed to the surface of each of metal particles, and simultaneously, the adsorbed ammonium polyacrylate suppresses the aggregation of the metal particles in the solvent according to an electric repulsion and a three-dimensional prevention effect. In the present invention, (a) of the polyacrylic acid and the ester or salt thereof can be used alone or in combination of two or more.

For (b) the organic group-substituted ammonium hydroxides used in the present invention, for example, alkyl group-substituted ammonium hydroxide such as tetramethyl ammonium hydroxide, tetraethyl ammonium hydroxide and tetrabutyl ammonium hydroxide, and alkyl group-substituted aryl group-substituted ammonium hydroxide such as trimethylphenyl ammonium hydroxide and benzyltrimethyl ammonium hydroxide can be introduced. Of these, the alkyl group-substituted ammonium hydroxide is preferable since it is easily adsorbed to the metal particles, and has a high electric repulsion. In the present invention, (b) the organic group-substituted ammonium hydroxide can be used alone or in combination of two or more.

For (c) the hydroxyl group-containing amine compounds used in the present invention, for example, alkanolamines can be introduced. Of these, dialkanolamines such as dimethanolamine, diethanolamine and dipropanolamine are preferable due to their excellent wettability to the metal particles. Diethanolamine is more preferable since aggregation over time of the metal particles can be suppressed most easily. In the present invention, (c) the hydroxyl group-containing amine compound can be used alone or in combination of two or more.

According to the present invention, the above dispersion auxiliary agent is added into a conductive nickel ink to prevent the aggregation over time of the particles of the nickel powder in the ink. The dispersion auxiliary agent used in the present invention may be at least one of the above described (a) to (c). However, (a) and (c) of these are recommended together since the nickel powder can be more stably dispersed.

When "the polyacrylic acid, the ester or salt thereof" is included in the conductive ink according to the present invention, and the amount of "the polyacrylic acid, the ester or salt thereof" is usually 0.05 parts by weight to 5 parts by weight, preferably from 0.1 parts by weight to 2 parts by weight against to 100 parts by weight of the metal powder, the ink performs the longest shelf life without disturbing the adhesion of the ink to the substrate, so it is preferable.

When "the organic group-substituted ammonium hydroxide" is included in the conductive ink according to the present invention, amount of "the organic group-substituted ammonium hydroxide" is usually 0.01 parts by weight to 5 parts by weight, preferably from 0.05 parts by weight to 1 parts by weight against to 100 parts by weight of the metal powder, the ink performs the longest life without disturbing the adhesion of the ink to the substrate, so it is preferable.

When "the hydroxyl group-containing amine compound" is included in the conductive ink according to the present invention, amount of "the hydroxyl group-containing amine compound" is usually 0.5 parts by weight to 30 parts by weight, preferably from 5 parts by weight to 20 parts by weight against to 100 parts by weight of nickel, the ink performs the longest life without disturbing the adhesion of the ink to the substrate, so it is preferable.

When the dispersing agents are co-used in the conductive ink according to the present invention and "the polyacrylic acid, the ester or salt thereof" and "the organic group-substituted ammonium hydroxide" are included, amount of "the organic group-substituted ammonium hydroxide" is usually 1 part by weight to 30 parts by weight, preferably from 5 parts by weight to 20 parts by weight against to 100 parts by weight of "the polyacrylic acid, the ester or salt thereof", the ink performs the longest life without disturbing the adhesion of the ink to the substrate, so it is preferable.

Surface Tension of Conductive Ink:

The conductive ink according to the present invention described below has a surface tension of 15 mN/m to 50 mN/m, and it makes formation of a circuit with an inkjet method and a dispenser method easy. Therefore, as for the amount of the surface tension-adjusting agent to be added, various agents or the like may be added to adjust the surface tension of the conductive ink to be usually 15 mN/m to 50 mN/m, preferably from 20 mN/m to 40 mN/m. When the surface tension of the conductive ink is out of the above range, the following phenomenon may take place: in particular, the conductive ink cannot be ejected from an inkjet nozzle; the conductive ink put on the positions deviated from the target printing position even if the conductive ink can be ejected from the nozzle; and continuously printing cannot be performed. Therefore, the present invention adjusts the surface tension of the conductive ink into the above range suitable for using the inkjet method to enable the formation of fine circuit wiring or the like using an inkjet apparatus.

Surface Tension-Adjusting Agent:

As for the surface tension-adjusting agent, additive agents having a surface tension of 40 mN/m or less are used. Using a surface tension-adjusting agent having such surface tension is the easiest way to adjust the surface tension of the ink to be suitable for being used for the inkjet apparatus. Also the viscosity can be easily adjusted by using a surface tension-adjusting agent to correspond to the design of the inkjet apparatus, and thereby, the fine wiring circuit can be formed. As for the surface tension-adjusting agent herein, it is preferable to use one or a combination of two or more selected from the group consisting of alcohols and glycols capable for using as the solvent and having a surface tension of 40 mN/m or less and a viscosity of 100 cP or less at 25 deg. C.

As alcohols having a surface tension of 40 mN/m or less and a viscosity of 100 cP or less at 25 deg. C. of the surface tension-adjusting agents, 1-butanol, 1-pentanol, 4-methyl-2-pentanol, 2-ethoxyethanol, 2-n-butoxyethanol and n-butyl carbitol can be introduced. In the present invention, 2-n-butoxyethanol or 1-butanol of the above surface tension-adjusting agents is recommended in view to maintain longer quality stability as the conductive ink.

In the conductive ink according to the present invention, the amount of the surface tension-adjusting agent to be blended may be an amount for suitably adjusting the surface tension of the conductive ink, and is not particularly limited. However, generally, the amount is usually from 1% by weight to 50% by weight, preferably from 3% by weight to 30% by weight in the conductive ink. When the amount of the surface tension-adjusting agent is less than 1% by weight, the surface tension cannot be adjusted. When the surface tension-adjusting agent of 50% by weight or more is added, the dispersed state of the fine metal powder contained in the conductive ink is drastically changed before and after adding the surface tension-adjusting agent, and as a result, the aggregation of the fine metal powder occurs. Since the occurrence of the aggregation disturbs the uniform dispersion of the fine metal powder which is the most important in the conductive ink, it cannot be used as the conductive ink.

The surface tension-adjusting agent is preferably prepared by one or in combination of two or more selected from the group consisting of alcohol and glycol having a boiling point of 100 to 300 deg. C. at normal pressure.

Adhesion Improver:

The dispersion medium constituting the conductive ink according to the present invention contains preferably one or two or more selected from the group consisting of a silane coupling agent, a titanium coupling agent, a zirconia coupling agent and an aluminum coupling agent as the adhesion improver.

As for the adhesion improver herein, not only one component but also combination of two or more selected from the group can be used. That is, the adhesion can be controlled so as to meet a substrate character for forming the circuit or the like by containing two or more components.

As the silane coupling agent herein, any one of vinyltrichlorosilane, vinyltrimethoxysilane, vinyltriethoxysilane, 2-(3,4 epoxycyclohexyl) ethyltriethoxysilane, 3-glycidxypropyltrimethoxysilane, 3-glycidxypropylmethyldiethoxysilane, 3-glycidxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2(aminoethyl)-3-aminopropylmethyldimethoxysilane, N-2(aminoethyl)-3-aminopropyltrimethoxysilane, N-2(aminoethyl)-3-aminopropyltriethoxysilane, 3-aminopropyltrimethoxysilane, 3-aminotriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane chloride salt, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetra sulfide, 3-isocyanatepropyltriethoxysilane, tetramethoxysilane, tetraethoxysilane, methyltrimethoxysilane, methyltriethoxysilane, dimethyltriethoxysilane, phenyltriethoxysilane, hexamethyldisilazane, hexyltrimethoxysilane or decyltrimethoxysilane can be recommended. Of these, methyltrimethoxysilane, methyltriethoxysilane or dimethyltriethoxysilane or the like is recommended in view of performing the stabilization of the adhesion to the substrate.

As the titanium coupling agent herein, any one of tetraisopropyltitanate, tetra-n-butyltitanate, butyltitanate dimer, tetra (2-ethylhexyl)titanate, tetramethyltitanate, titanium acetylacetonate, titanium tetraacetylacetonate, titanium ethylacetoacetate, titanium octanediorate, titanium lactate, titanium triethanolaminate or polyhydroxytitanium stearate can be recommended. Of these, tetraisopropyltitanate, tetra-n-butyltitanate or titanium lactate or the like is recommended in view of performing the stabilization of the adhesion to the substrate.

As the zirconium coupling agent herein, any one of zirconium n-propylate, zirconium n-butyrate, zirconium tetraacetylacetonate, zirconium monoacetylacetonate, zirconium bisacetylacetonate, zirconium monoethylacetoacetate, zirconium acetylacetonate bisethylacetoacetate, zirconium acetate, or zirconium monostearete can be recommended. Of these, zirconium n-propylate, zirconium n-butyrate, zirconium tetraacetylacetonate, zirconium monoacetylacetonate, zirconium bisacetylacetonate, zirconium monoethylacetoacetate, zirconium acetylacetonate bisethylacetoacetate, or zirconium acetate is recommended in view of performing the stabilization of the adhesion to the substrate.

As the aluminum coupling agent herein, anyone of aluminum isopropylate, mono sec-butoxyaluminumdiisopropylate, aluminum sec-butyrate, aluminium ethylate, ethylacetoacetatealuminumdiisopropylate, aluminumtris (ethylacetoacetate), alkylacetoacetatealuminumdiisopropylate, aluminum monoacetylacetonatebis (ethylacetoacetate), aluminumtris (acetylacetonate), aluminum monoisopropoxymonooleoxyethylacetoacetate, cyclic aluminum oxide isopropylate, cyclic aluminum oxide octylate or cyclic aluminumoxide stearate can be recommended. Of these, ethylacetoacetatealuminumdiisopropylate, aluminumtris (ethylacetoacetate), alkylacetoacetatealuminumdiisopropylate, aluminum monoacetylacetonatebis (ethylacetoacetate), or aluminumtris (acetylacetonate) is recommended in view of performing the stabilization of the adhesion to the substrate.

Metal Powder or Metal Oxide Powder:

The metal powder or metal oxide powder herein is one or mixed powder of two or more selected from nickel powder, silver powder, gold powder, platinum powder, copper powder, palladium powder and indium-tin oxide. The primary particle size and particle size distribution or the like of the metal powder or metal oxide powder are not particularly limited. It is because, as long as the powder performance of the metal powder or metal oxide powder are same, the conductive ink of the present invention using the above dispersion medium composition has higher substrate adhesion than those of the conventional conductive ink and the formed conductor film having more excellent film density provides reduced conductor resistance.

However, in view of using an inkjet method, the average primary particle size of the metal powder or metal oxide powder is preferably 500 nano meter or less. The average primary particle size exceeding 500 nano meter causes the extreme clogging of the conductive ink to the inkjet nozzle easily to show difficulty in continuous printing. Even if the printing can be performed, the film thickness of the wiring or electrode to be formed is excessively increased, and thereby the fine wiring is not formed.

Furthermore, the fine metal powder or metal oxide powder having a proper primary particle size may be suitably selected and used according to the required level of the circuit to be formed. However, in view of the concept of fine particles, the fine particle metal powder or metal oxide powder is usually selected and used in the range of 3 nano meter to 500 nano meter, preferably from 5 nano meter to 200 nano meter, and more preferably from 10 nano meter to 150 nano meter. As for the average primary particle size of the powder particle of the fine particle less than 3 nano meter, the process may be not established at the present stage, and the verification due to the experiment cannot be performed. On the other hand, when the average primary particle size exceeds 500 nano meter, it is difficult to form wiring or electrode having a width of 40 micron meter or less as the target. Also, since the film thickness of the formed wiring or electrode is excessively increased, the average primary particle size exceeding 500 nano meter becomes not suitable. In the tendency, the fine particles with the fine average primary particle size of the powder particle has a low possibility of causing the clogging of the nozzle of the inkjet, so it is suitable for formation of a fine circuit. In the present invention, the average primary particle size means a particle size obtained by calculation after observing the particle sizes of at least 25 powder particles shown in one view when being observed by a scanning electron microscope or a transmission electron microscope by integrating and averaging the particle sizes.

The fact that the fine particles have small average primary particle size is the foundation of the fine particles. However, when the aggregation of the fine particles in the conductive ink occurs, the particle size as a secondary structural object increase and the clogging of the inkjet nozzle is easily caused. Therefore, it is necessary to specify the aggregated particles as the secondary structural object of the fine particle metal powder in the conductive ink to a size to obviate the clogging of the inkjet nozzle, which is experimentally confirmed. The clogging of the inkjet nozzle can be almost certainly prevented by specifying the maximum particle size of the aggregation particle to 0.8 micron meter or less. As the investigation method of the particle aggregation, a laser type particle size distribution measuring device is used.

The shape of the particles are not particularly limited, and is described as one including all the concepts of the particles having a spherical or flaky particle shape, or having a surface on which a surface coated layer is provided. However, the conductive ink according to the present invention is premised on a main use for the circuit formation of electronic materials. Therefore, it is assumed that the metal powder is selected from nickel powder, silver powder, gold powder, platinum powder, copper powder, palladium powder and indium-tin oxide frequently used for the application of the electronic materials, and the primary particle size of the metal powder is 500 nano meter or less. From the view of the temporal change and sintering performance or the like of the conductive ink, such as metal powder having a surface treated by an oleic acid or a stearic acid or the like and oxide coated powder having a surface on which a predetermined oxide is adhered, one prepared by considering the performance required for the conductive ink may be alternatively used.

Of these, assuming to use the nickel powder in the conductive ink according to the present invention, a dense film with low resistance can be formed by adopting the following fine nickel powder, and a circuit having excellent quality can be obtained. Specifically, the long term shelf life of the quality as the powder can be secured by storing extremely small fine nickel powder not as powder but in a slurry state.

As described above, when the fine nickel powder having an average primary particle size of 100 nano meter or less is used for a conductive paste according to the present invention, the fine nickel powder in the form of nickel slurry is recommended. That is, "in the nickel slurry containing nickel particles, the nickel slurry consisting of just an organic solvent and nickel particles having an average primary particle size of 100 nanometer or less" is used. This nickel slurry has a feature that the nickel slurry is constituted by only an organic solvent and the nickel particles without using an organic agent such as a resin, and the organic solvent can be vaporized completely by heating. The nickel slurry, which is different from nickel colloid, has a character that the nickel particles easily settle out when the nickel slurry is left. Therefore, the stored nickel slurry requires stirring before using but, since the solution of the nickel slurry does not contain an unnecessary organic agent such as resin components, the surface of each of the nickel particles is not contaminated by the organic agent, and adjustment of the resin components when being used as the raw material of nickel ink is easy.

In addition, the nickel particles having an average primary particle size of 100 nano meter or less are merely described herein. However, it was conventionally difficult to produce the fine nickel particles of this level as a target. Mass-productivity of the fine nickel particles is poor and they cannot be supplied to market. The fine nickel particles include fine nickel particles which could not be conventionally supplied to the market.

The nickel particles having an average primary particle size exceeding 100 nano meter can be produced to some extent even when the conventional production method is applied. On the other hand, the average primary particle size of the nickel particles in the nickel slurry used in the present invention shows a value of 100 nanometer or less even including deviation generated inevitably in production. Moreover, the fine nickel particles of the range of 10 nano meter to 70 nano meter can be obtained by applying a more optimal production condition, so the nickel slurry with high quality can be provided. Disclosing herein, the nickel particles of less than 10 nano meter may not hardly exist completely, and are produced in a certain fixed ratio of the process variation. However, the nickel particles of less than 10 nano meter is neglected because it is difficult to find visually even by a field emission scanning electron microscope (FE-SEM), and strictly measuring of the average primary particle size to obtain statistical data such as deviations is also difficult. Therefore, it is preferable to observe the nickel particles contained in the nickel slurry according to the present invention using an apparatus enabling the observation in the magnification of the transmission electron microscope level enabling the observation magnification of hundreds of thousands times or more. If it is assumed that the nickel slurry herein is processed into the conductive ink before using, the smaller the average primary particle size of the nickel particles, a finer circuit and electrode or the like can be easily formed. Therefore, the nickel particles are preferred to have fine and excellent particle size distribution.

As general characteristics of the particles of the metal powder, the finer particles may tend to cause the aggregation of the pseudo connection of the fine particles easily. Therefore, even if the average primary particle size of the nickel particles in the nickel slurry according to the present invention is very fine, the secondary particles in which the particles are firmly aggregated with each other are constituted the nickel ink cannot be used as the nickel ink for forming the above fine circuit or the like. Then, the standard deviation of the primary particle size is used as the index for guessing that the particle size distribution of the particles is good.

Herein, the standard deviation of the primary particle size of the above nickel particles will be described. Since the average primary particle size of the nickel particles contained in the nickel slurry according to the present invention is extremely fine in nanometer order, it is difficult to control the particle size in the strict meaning in the production, and the nickel particles have a performance that the deviation of the particle size differ according to average primary particle size as the target. Then, when the inventors considered the standard deviation of the primary particle size of the above nickel particles, the inventors used the value not a mere numerical value of the standard deviation but the value [average primary particle size (nanometer)]/2.5 or less as the index for standard deviation for showing good particle dispersion on the basis of the average primary particle size. When the standard deviation exceeds [average primary particle size (nano meter)]/2.5, the variation in the primary particles when being observed by a transmission electron microscope look visibly large, and of course it cannot be said that the nickel particles have narrow particle size distribution. The average primary particle size of these nickel particles is observed by a transmission electron microscope photograph, the standard deviation is calculated by the particle size distribution obtained from the observation image, and the accuracy of the distribution of the particles is determined by comparing the standard deviation with [average primary particle size (nano meter)]/2.5.

When the nickel particles having a particle size of nano meter order is measured by a usual laser diffraction scattering type particle size analysis method, not a common apparatus but a dynamic light scattering type (Doppler scattering light analysis) apparatus capable of measuring ultra fine particles must be used. Then, the present inventors have used UPA150 capable of measuring the particle size distribution of 0.0032 micron meter to 6.5406 micron meter manufactured by Nikkiso Co., Ltd. However, the investigation data when being measured by this apparatus often shows two peaks because of the performance of a detector, and the cause of this phenomenon is not clear. Therefore, it is not preferable even it is also possible to calculate the standard deviation of the particle size distribution without particularly taking this phenomenon into consideration.

Then, the present inventors considered that to realize variation of the nickel particles having the average primary particle size of nano meter order by the standard deviation, the value having more reliability was obtained by calculating the standard deviation based on the primary particle size directly measured from the observation image (observation image containing 25 to 60 nickel particles) of the transmission electron microscope. The method showed that the value of the standard deviation of the particle size distribution of the nickel particles in the nickel slurry according to the present invention was almost in the range of [average primary particle size (nanometer)]/6.0 to [average primary particle size (nano meter)]/2.5. It can be said that the deviation of this level sufficiently acceptable for use as the conductive ink used for the formation of the fine circuit or the like.

It is also preferable to adopt the coefficient of variation as the index for viewing the particle dispersion. Herein, the coefficient of variation, CV value is represented by the relationship between the average primary particle size D and the standard deviation SD of the particle size distribution, SD/D*100. The smaller CV value means the uniform particle size of the particles, which means that variation is small. The average primary particle size herein is a primary particle size directly measured from the observation image (observation image containing 25 to 60 nickel particles) of the transmission electron microscope.

The content of the nickel particles in the above nickel slurry is preferably from 15% by weight to 92% by weight. When the nickel ink is produced by using the nickel slurry according to the present invention, various organic agents or the like as a binder and a viscosity adjusting agent or the like are added into the nickel slurry. Therefore, in view of securing the content of the nickel particles required in the nickel ink, the content of the above range is preferable.

The organic solvent used for the nickel slurry is not particularly limited as long as the organic solvent does not cause chemical deterioration such as oxidization of the surface of the particle as the nickel powder. As for the organic solvents capable of being used include terpenes such as terpineol and dihydroterpineol and alcohols such as octanol and decanol can be introduced. The above organic solvents can be used alone or in combination of two or more.

The production method of the nickel slurry described above will be described. One of the production method of the nickel slurry, a production method of the nickel slurry comprising: the steps of; heating a reaction solution containing a nickel salt, polyol and a precious metal catalyst to a reaction temperature; reducing nickel ions contained in the reaction solution while maintaining the reaction temperature; and then replacing with an organic solvent, is preferable to adopt which is characterized in that an amino acid is added into the above reaction solution.

The nickel salt used herein is not particularly limited, and for example, nickel hydroxide, nickel sulfate, nickel chloride, nickel bromide and nickel acetate can be introduced. Of these, the nickel hydroxide is particularly preferable since the nickel hydroxide does not contain elements such as sulfur and halogen which gives negative effects in the nickel ink.

The concentration of the nickel salt is preferably from 1 g/l to 100 g/l as nickel concentration in the reaction solution. In the concentration of less than 1 g/l, the production efficiency industrially required cannot be obtained. In the concentration exceeding 100 g/l, the particle size tends to be increased by the aggregation of the nickel particles reduced and deposited, and the nickel particles having an average primary particle size of 50 nano meter or less cannot be obtained.

The polyol used in producing this nickel slurry means a substance having a hydrocarbon chain and a plurality of hydroxyl functional groups. As for examples of the polyols used are at least one selected from the group consisting of ethyleneglycol (boiling point: 197 deg. C.), diethyleneglycol (boiling point: 245 deg. C.), triethylene glycol (boiling point: 278 deg. C.), tetraethylene glycol (boiling point: 327 deg. C.), 1,2-propanediol (boiling point: 188 deg. C.), dipropylene glycol (boiling point: 232 deg. C.), 1,2-butanediol (boiling point: 193 deg. C.), 1,3-butanediol (boiling point: 208 deg. C.), 1,4-butanediol (boiling point: 235 deg. C.), 2,3-butanediol (boiling point: 177 deg. C.), 1,5-pentanediol (boiling point: 239 deg. C.) and polyethylene glycol. Of these, the ethylene glycol is preferable since the ethylene glycol has a low boiling point, is liquid at normal temperature, and has an excellent handleability. Herein, the polyol acts as a reducing agent to the nickel salt, and functions also as a solvent.

The amount of the polyol to be added is defined with the concentration of the polyol in the reaction solution corresponds to the nickel concentration. Therefore, the polyol is preferably added so that the polyol concentration in the reaction solution is in equivalents 11 to 1100 against the nickel amount based on above nickel concentration range. In the concentration of less than 11 equivalents, the nickel concentration is too high to cause the aggregation of the deposited particles easily. When the above concentration exceeds 1100 equivalents, even considering on the upper limit concentration of nickel concentration, formation of the organic compound layer onto the nickel particle surface deposited, and the organic compound layer might be unnecessary thicker even the reaction time is lengthened slightly, it may causes the increase of the resistance when the nickel ink is processed to form the circuit or the like.

The precious metal catalyst used for producing the nickel slurry promotes the reduction reaction of the nickel salt by the polyol in the above reaction solution. Examples thereof include palladium compounds such as palladium chloride, palladium nitrate, palladium acetate, and palladium ammonium chloride, silver compounds such as silver nitrate, silver lactate, silver oxide, silver sulfate, silver cyclohexanoic acid and silver acetate, platinum compounds such as hydrogen hexachloroplatinate (IX) hexahydrate, potassium chloroplatinate, and sodium chloroplatinate, and gold compounds such as chloroauric acid and sodium chloroaurate. Of these, palladium nitrate, palladium acetate, silver nitrate or silver acetate is preferable since the purity of the obtained nickel powder is easily increased and the manufacture cost thereof is low. As long as the above compounds are stable, the above catalyst can be used is in the form as it is or in the form of the solution of the compound.

The concentrations of these precious metal catalysts in the reaction solution arrange the reduction deposit speed of the nickel particles. Therefore, it is necessary to obtain the optimal reduction speed in producing the nickel particles having the average primary particle size of 100 nano meter or less as described above. Therefore, the concentration of the precious metal catalyst in the reaction solution is preferably from 0.01 mg/l to 0.5 mg/l. The concentration of the precious metal catalyst of less than 0.01 mg/l reduces the reduction speed, coarsens the nickel particles, and cannot satisfy the operational condition in the industrial meaning. The concentration of the precious metal catalyst exceeding 0.5 mg/l increases the reduction speed, enlarges the variation in the particle size of the obtained nickel particles, and generates many coarse particles exceeding 100 nano meter.

For example, the reaction solution containing the nickel salt, polyol and precious metal catalyst described above can be prepared by charging the nickel salt, the polyol and the precious metal catalyst in the water with stirring and mixing. And when the precious metal catalyst is as a solution as for palladium nitrate, the reaction solution can be prepared only by mixing the nickel salt, the polyol and the precious metal catalyst without additional water. When the nickel salt, the polyol and the precious metal catalyst are mixed to prepare the reaction solution, the procedure or mixing method to be added are not particularly limited. For example, the nickel salt, the polyol, the precious metal catalyst, and a dispersing agent to be described below if necessary may be preliminarily mixed to prepare a slurry and the slurry and the balance of the polyol may be mixed to produce a reaction solution.

In the manufacturing of the nickel slurry, an amino acid is added into the above reaction solution. Thus, adding the amino acid into the reaction solution can reduce the primary particle size of the nickel particles and improve the dispersion thereof. As for above amino acid, which has a boiling point or decomposition point of over reaction temperature or more and forms a complex with nickel and the precious metal catalyst in the polyol. Specifically, L-arginine and/or L-cystine are recommended. The amount of the amino acid to be added is preferably from 0.01% by weight to 20% by weight against to nickel amount in the reaction solution. When the amount of the amino acid to be added is less than 0.01% by weight, the above effect is not obtained. Even if the amount of the amino acid exceeding 20% by weight is added, further effect is not obtained, which is economically disadvantageous.

The above reaction solution contains some amount of dispersing agent if necessary, and thereby the obtained nickel particles can be finer particles; the aggregation of the particles reduced and deposited can be prevented; and the particle size distribution can be made narrower. Therefore, this dispersing agent is necessary only in the reaction process, and is unnecessary in the nickel slurry which is a product, so it is preferable not to contain the dispersing agent in the nickel slurry. Examples of the dispersing agents used in the present invention include nitrogen-containing organic compounds such as polyvinylpyrrolidone, polyethylenimine, polyacrylamide and poly (2-methyl-2-oxazoline), and polyvinyl alcohol. Of these, polyvinylpyrrolidone is preferable since the particle size distribution of the obtained nickel particles is made narrow easily. The above dispersing agents can be used alone or in combination of two or more. In containing the dispersing agent, the amount to be added is different according to the kind of the dispersing agent. However, preferably, the amount is usually 1% by weight to 20% by weight against to the amount of nickel on the basis of the amount of nickel in the reaction solution, and more preferably from 1% by weight to 12% by weight. When the amount of the dispersing agent is less than 1% by weight, the improved effect of the particle size distribution of the nickel particles in the nickel slurry cannot be exhibited as the effect of the addition of the dispersing agent. On the other hand, even if the dispersing agent exceeding 20% by weight is added, the dispersing agent-containing effect is not further changed, and rather, the contamination caused by the dispersing agent as the organic agent of the nickel particles increase.

In the manufacturing of the nickel slurry, nickel particles are produced while the above reaction solution is heated to the above reduction temperature, and the nickel salt in the reaction solution is reduced while maintaining the reduction temperature.

Herein, the reaction temperature where the reduction reaction is performed will be described. As the reaction temperature, there is preferably adopted the temperature range of 150 deg. C. to 210 deg. C., and preferably from 150 deg. C. to 200 deg. C. The reaction temperature in the present invention means the solution temperature of the reaction solution. When the reaction temperature is less than 150 deg. C. with the range of the above reaction solution composition, the reduction reaction rate is slow, and the operational condition cannot be industrially used. When the reaction temperature exceeds 210 deg. C., it is not preferable because the product obtained in the reduction reaction easily contains carbon to be a nickel carbide particle.

Since suitable time for maintaining the reaction solution at the above reduction temperature is different according to the composition and reduction temperature of the reaction solution, the time cannot be commonly specified. However, the time is usually for 1 hour to 20 hours, and preferably for 2 hours to 15 hours. When the time for maintaining the reaction solution at the above reduction temperature is within the range, the growth of the nickel particle cores is suppressed, and many cores of the nickel particles are easy to be generated. Thereby, the particle growth of the nickel particles in the system becomes almost uniform, and the coarsening or aggregation of the obtained nickel particles can be suppressed. Thereby, as long as the above reduction temperature is maintained only for the above time in the present invention, the temperature of the reaction solution can be set to a temperature outside of the range of the above reduction temperature afterward. For example, in order to accelerate the speed of the reduction reaction, the temperature of the reaction solution may be set to the temperature exceeding the above reduction temperature after keeping.

Next, the reaction solution in which nickel particles are obtained is replaced with the organic solvent to produce a nickel slurry. As described above, examples of the organic solvents used herein include terpenes such as terpineol and dihydroterpineol and alcohols such as octanol and decanol. The above organic solvents can be used alone or in combination of two or more.

Viscosity of Conductive Ink:

In the present invention, the viscosity of the conductive ink at 25 deg. C. is set to 60 cP or less to ease circuit formation or the like by using the inkjet method or the dispenser method. The viscosity adjustment in the present invention is performed by optimally blending the solvent, dispersing agent and oxide coated metal powder described above. The reason why lower limit value of the viscosity is not daringly described is that the place and object where the conductive ink of each metal is used for the circuit formation are different, and the desired wiring, electrode size and shape are different. If the viscosity at 25 deg. C. exceeds 60 cP, even when the formation of the fine wiring and electrode is attempted by using the inkjet method and the dispenser method, the viscosity of the conductive ink is higher than the energy for ejecting the conductive ink from the nozzle. Thereby it may be difficult to eject the droplet of the conductive ink from the nozzle stably. When the viscosity at 25 deg. C. is 60 cP or less, it is turned out that the fine wiring or the electrode can be formed by the inkjet method or the dispenser method experimentally.

<Method for Producing Conductive Ink According to the Present Invention>

The method for producing the conductive ink described above is not particularly limited. Even when any method is adopted, finally, the conductive ink may contain at least the metal powder, the main solvent and the film density improver, and suitably contain the dispersion auxiliary agent, the surface tension adjuster and the adhesion improver. However, in view of using the dispersion auxiliary agent, it is preferable to disperse the metal powder in the main solvent to produce a mother slurry, followed by adding the dispersion auxiliary agent to the mother slurry in this stage, and suitably add the surface tension adjuster and/or the adhesion improver according to any procedures to be described below.

Example 1

In this Example, a conductive ink was prepared by the following procedures; an electrode film was formed using the conductive ink; and the performances on the conductor resistance, adhesion and cross section of the electrode film were examined.

<Production of Nickel Particles>

445.28 g of ethylene glycol in a reaction vessel charged with 31.31 g of nickel hydroxide, 2.15 g of polyvinylpyrrolidone (PVP), 0.69 ml of a 100 g/l palladium nitrate solution and 1.0 g of L-arginine was heated for 10 hours at 190 deg. C. while being stirred and nickel particles having an average primary particle size of 37.86 nano meter was obtained. This reaction solution was subjected to decantation using ethylene glycol to rinse and remove PVP contained in the reaction solution. Further, decantation was subjected twice using terpineol to produce a nickel slurry containing 80% by weight of nickel powder and terpineol as the balance.

Figure 2:
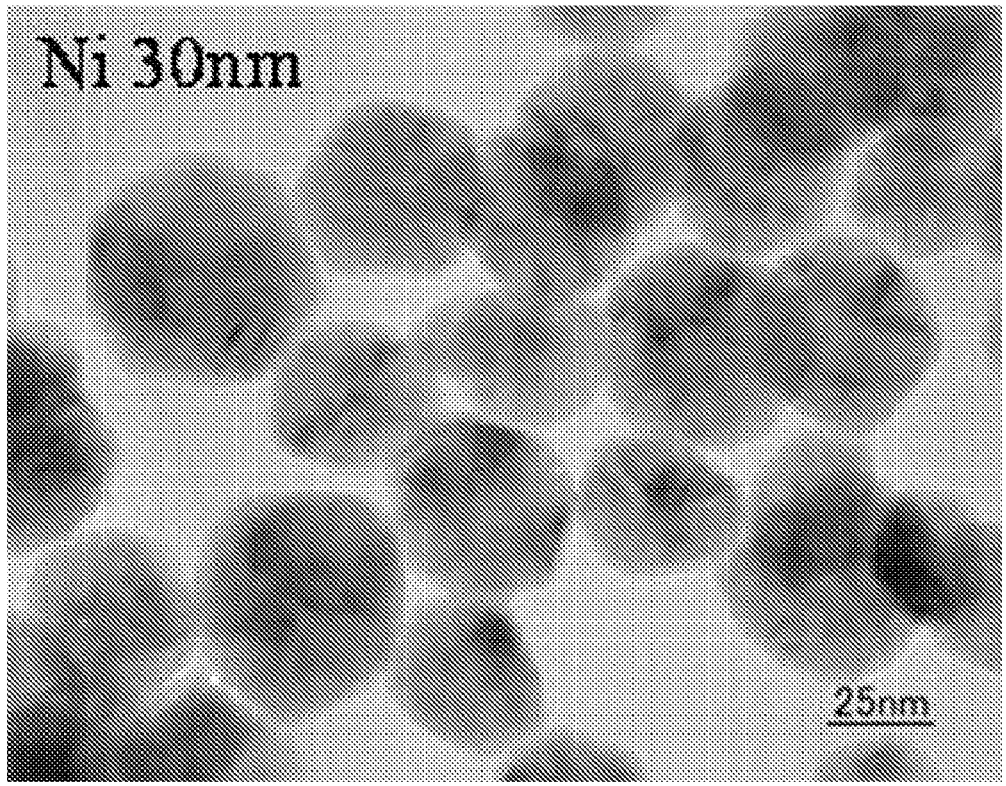
FIG. 2 shows a transmission electron microscope image of fine nickel powder contained in a nickel slurry used for a conductive ink (nickel ink) according to the present invention.

Examination results on the primary particle size (average, standard deviation, maximum value, minimum value) on 50 nickel particles in the above nickel slurry observed by using a transmission electron microscope. Observation image of FE-SEM (×100000) is shown in FIG. 1. However, FIG. 1 shows that particles cannot be sufficiently observed with the resolution of FE-SEM level. Then, the observation image in the transmission electron microscope is shown in FIG. 2. In FIG. 2, the state of the obtained nickel particles can be clearly observed. In the following Examples, the same nickel slurry as that obtained herein was used as a raw material also.

<Production of Conductive Ink>

Preparation of Dispersion Auxiliary Agent:

The dispersion auxiliary agent is prepared by charging 380 g of diethanolamine (manufactured by Wako Pure Chemical Industries, Ltd.), 45.6 g of a 44% ammonium polyacrylate solution (manufactured by Wako Pure Chemical Industries, Ltd.), and 13.4 g of a 15% tetramethylammonium hydroxide solution (manufactured by Wako Pure Chemical Industries, Ltd.) into 1 L beaker with stirring by a magnetic stirrer.

Preparation of Metal Powder Slurry:

3 L of the nickel slurry obtained in the above production of nickel particles part was separated into solid and liquid by mean of a centrifugal force, and a supernatant liquid was removed. Next, in order to remove organic substrates or the like used for the reaction contained in the obtained solid content, same amount of the pure water with removed supernatant liquid was added to the obtained solid and were then sufficiently mixed. Recovering of the solid content by mean of centrifugal force was then performed and the operation was performed for 3 times. The pure water was added to obtained solid content to prepare the nickel concentration of 21 wt %, and the solid content and pure water were sufficiently mixed to produce an aqueous nickel slurry. Then, 14.8 g of the dispersion auxiliary agent was added to 262.3 g of the water nickel slurry. Next, to obtain a nickel slurry having dispersed nickel particles, the slurry is subjected to dispersion processing by T. K. FILMICS (manufactured by Tokushu Kika Kogyo Co., Ltd.) which is a high-speed emulsifying/dispersing machine.

Preparation of Conductive Ink:

Next, the nickel slurry was processed for 30 minutes by a paint shaker (manufactured by Asada Iron Works CO., LTD) with zirconia beads (manufactured by Nikkato Corporation, phi 0.3 mm) as dispersing media. After that, 19.7 g of 2-n-butoxyethanol (manufactured by Kanto Kagaku, surface tension: 28.2 mN/m) as a surface tension-adjusting agent and 13.8 g of titanium lactate (TC-315, manufactured by Matsumoto Pure Chemical Industries, Ltd.) as an adhesion improver were added to the nickel slurry and the slurry was further processed for 30 minutes by the paint shaker (manufactured by Asada Iron Works CO., LTD).

Then, in addition, 1.89 g of a tungstic acid (manufactured by Wako Pure Chemical Industries, Ltd.) as a film density improver was added to the slurry. The slurry was processed by the paint shaker (manufactured by Asada Iron Works CO., LTD) for 30 minutes. Next, the slurry was passed through a cartridge-type filter (MCP-3, manufactured by Advantec Toyo Kaisha, Ltd.) to remove particles of 5 micron meter or more contained in the slurry. After passing through the resulting slurry with a cartridge-type filter (MCP-JX, Advantec Toyo Kaisha, Ltd.) again to remove particles of 1 micron meter or more, a filtrate (hereinafter, referred to as "conductive ink A") was obtained.

<Evaluation as Conductive Ink>

Measurement of Film Resistance:

Film of the above conductive ink A was formed on an alkali-free glass substrate OA-10 (manufactured by Nippon Electric Glass Co., Ltd.) by using a spin coater (manufactured by MIKASA Company) with 2500 rpm for 10 seconds. Next, to obtain a nickel electrode film having a film thickness of about 500 nano meter, the formed conductive ink A film is heated at 300 deg. C. for 2 hours in the hydrogen-nitrogen mixing atmosphere of which the hydrogen content is 2 volume %. The specific resistance of the electrode film was $3.2 \times 10^{-4}$ Ohm·cm, measured by a four-probe resistance measuring apparatus: RORESTER GP (manufactured by Mitsubishi Chemical Co., Ltd.).

Evaluation of Adhesion:

The adhesion of the electrode film to a glass substrate show good adhesion of class 0 when examined by a cross cut method according to JIS K 5600, paragraphs 5 to 6. On the electrode film prepared as described above after rinsing with ultrasonic in water for 10 minutes, followed by rinsing with ultrasonic in acetone for 10 minutes, no exfoliation of the electrode film was observed when the electrode film was examined by a microscope.

Figure 3:
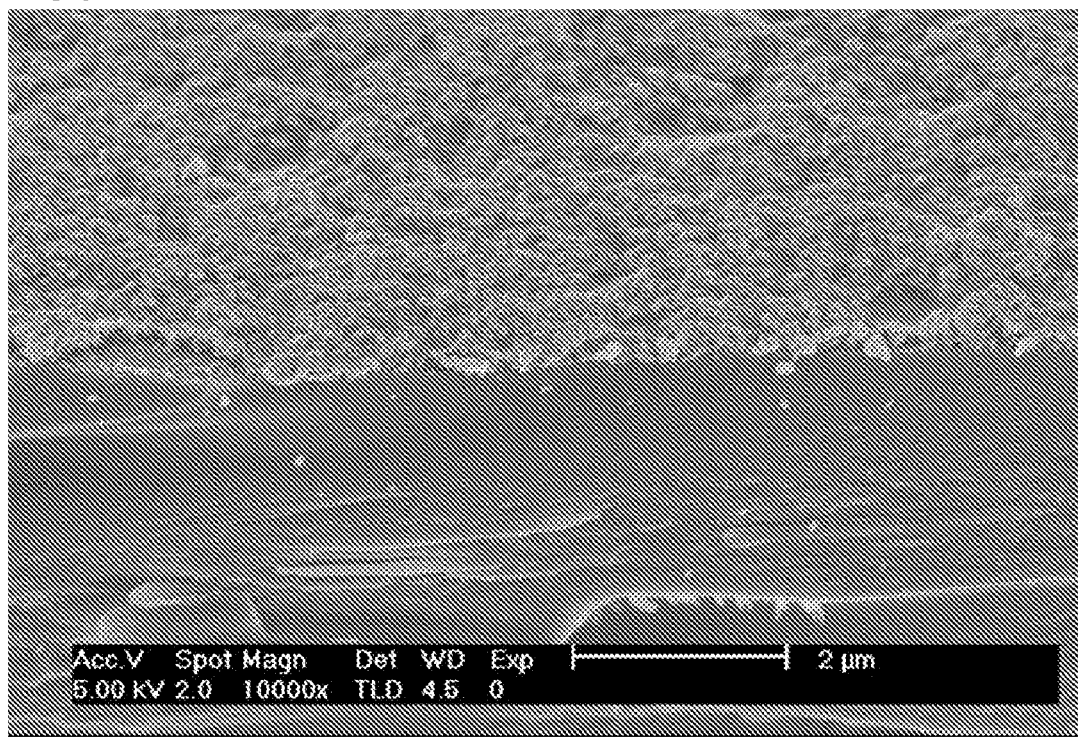
FIG. 3 shows a scanning electron microscope image of the cross section of an electrode film (Example 1)

Observation of Cross Section of Electrode Film:

In the observation of cross section on electrode film prepared as described above by a scanning electron microscope (FE-SEM, manufactured by FEI COMPANY), dense film was obtained as shown in FIG. 3.

Example 2

Preparation of Conductive Ink

In this Example, a conductive ink B was prepared in the same manner as in Example 1 except that citrate nickel is used as the film density improver to be added. Therefore, in order to avoid repeated description, the description of the manufacture process herein is omitted.

<Evaluation as Conductive Ink>

Measurement of Film Resistance:

Film of the above conductive ink B was formed on an alkali-free glass substrate OA-10 (manufactured by Nippon Electric Glass Co., Ltd.) by using a spin coater (manufactured by MIKASA Company) with 2500 rpm for 10 seconds. The specific resistance of the electrode film was $2.5 \times 10^{-4}$ Ohm·cm, measured by a four-probe resistance measuring apparatus: RORESTER GP (manufactured by Mitsubishi Chemical Co., Ltd.).

Evaluation of Adhesion:

The adhesion of the electrode film to a glass substrate show good adhesion of class 0 when examined by a cross cut method according to JIS K 5600, paragraphs 5 to 6. On the electrode film prepared as described above after rinsing with ultrasonic in water for 10 minutes, followed by rinsing with ultrasonic in acetone for 10 minutes, no exfoliation of the electrode film was observed when the electrode film was examined by a microscope.

Figure 4:
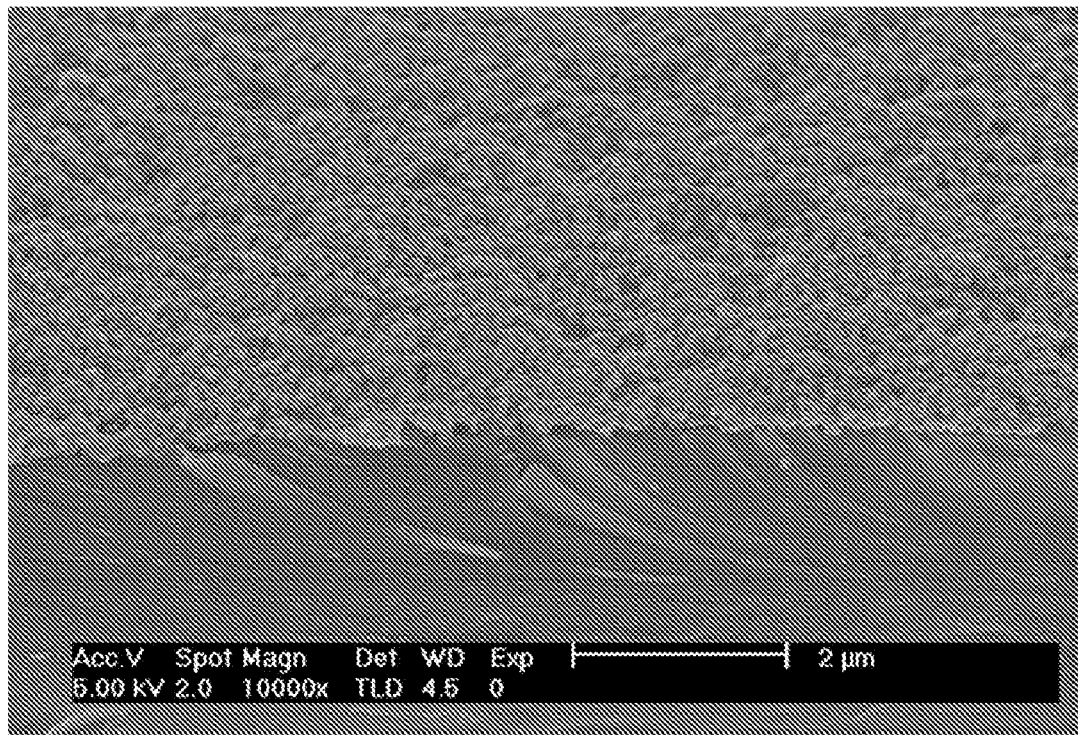
FIG. 4 shows a scanning electron microscope image of the cross section of an electrode film (Example 2)

Observation of Cross Section of Electrode Film:

In the observation of cross section on electrode film prepared as described above by a scanning electron microscope (FE-SEM, manufactured by FEI COMPANY), dense film was obtained as shown in FIG. 4.

Example 3

Preparation of Conductive Ink

In this Example, a conductive ink C was prepared in the same manner as in Example 1 except that copper acetate is used as the film density improver to be added. Therefore, in order to avoid repeated description, the description of the manufacture process herein is omitted.

<Evaluation as Conductive Ink>

Measurement of Film Resistance:

Film of the above conductive ink C was formed on an alkali-free glass substrate OA-10 (manufactured by Nippon Electric Glass Co., Ltd.) by using a spin coater (manufactured by MIKASA Company) with 2500 rpm for 10 seconds. The specific resistance of the electrode film was $5.92 \times 10^{-4}$ Ohm·cm, measured by a four-probe resistance measuring apparatus: RORESTER GP (manufactured by Mitsubishi Chemical Co., Ltd.).

Evaluation of Adhesion:

The adhesion of the electrode film to a glass substrate show good adhesion of class 0 when examined by a cross cut method according to JIS K 5600, paragraphs 5 to 6. On the electrode film prepared as described above after rinsing with ultrasonic in water for 10 minutes, followed by rinsing with ultrasonic in acetone for 10 minutes, no exfoliation of the electrode film was observed when the electrode film was examined by a microscope.

Figure 5:
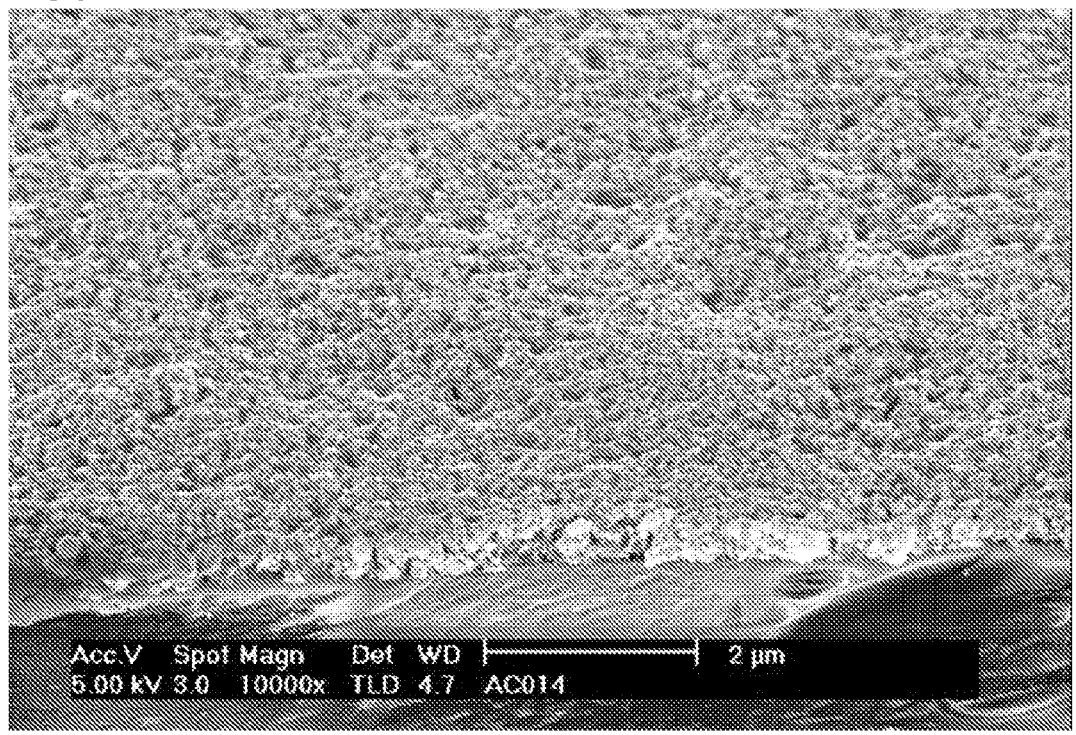
FIG. 5 shows a scanning electron microscope image of the cross section of an electrode film (Example 3)

Observation of Cross Section of Electrode Film:

In the observation of cross section on electrode film prepared as described above by a scanning electron microscope (FE-SEM, manufactured by FEI COMPANY), dense film was obtained as shown in FIG. 5.

Example 4

Preparation of Conductive Ink

In this Example, a conductive ink D was prepared in the same manner as in Example 1 except that a molybdic acid is used as the film density improver to be added. Therefore, in order to avoid repeated description, the description of the manufacture process herein is omitted.

<Evaluation as Conductive Ink>

Measurement of Film Resistance:

Film of the above conductive ink D was formed on an alkali-free glass substrate OA-10 (manufactured by Nippon Electric Glass Co., Ltd.) by using a spin coater (manufactured by MIKASA Company) with 2500 rpm for 10 seconds. The specific resistance of the electrode film was $5.28 \times 10^{-4}$ Ohm·cm, measured by a four-probe resistance measuring apparatus: RORESTER GP (manufactured by Mitsubishi Chemical Co., Ltd.).

Evaluation of Adhesion:

The adhesion of the electrode film to a glass substrate show good adhesion of class 0 when examined by a cross cut method according to JIS K 5600, paragraphs 5 to 6. On the electrode film prepared as described above after rinsing with ultrasonic in water for 10 minutes, followed by rinsing with ultrasonic in acetone for 10 minutes, no exfoliation of the electrode film was observed when the electrode film was examined by a microscope.

Figure 6:
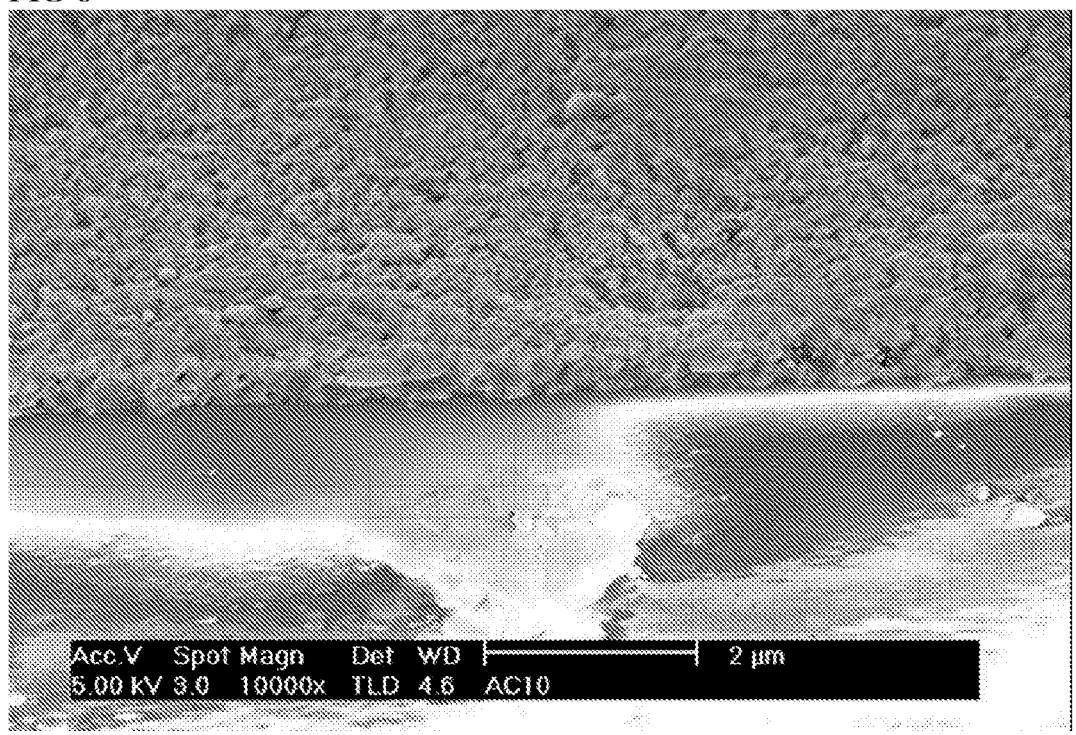
FIG. 6 shows a scanning electron microscope image of the surface of an electrode film (Example 4)

Observation of Cross Section of Electrode Film:

In the observation of cross section on electrode film prepared as described above by a scanning electron microscope (FE-SEM, manufactured by FEI COMPANY), dense film was obtained as shown in FIG. 6.

Comparative Example

Preparation of Conductive Ink

In the comparative example, a conductive ink G to be compared with the above Examples was prepared in the same manner as in Example 1 except that the film density improver to be added is omitted. Therefore, in order to avoid repeated description, the description of the manufacture process herein is omitted.

<Evaluation as Conductive Ink>

Measurement of Film Resistance:

Film of the above conductive ink G was formed on an alkali-free glass substrate OA-10 (manufactured by Nippon Electric Glass Co., Ltd.) by using a spin coater (manufactured by MIKASA Company) with 2500 rpm for 10 seconds. The specific resistance of the electrode film was $4.10 \times 10^{-3}$ Ohm·cm, measured by a four-probe resistance measuring apparatus: RORESTER GP (manufactured by Mitsubishi Chemical Co., Ltd.).

Evaluation of Adhesion:

The adhesion of the electrode film to a glass substrate show good adhesion of class 0 when examined by a cross cut method according to JIS K 5600, paragraphs 5 to 6. On the electrode film prepared as described above after rinsing with ultrasonic in water for 10 minutes, followed by rinsing with ultrasonic in acetone for 10 minutes, no exfoliation of the electrode film was observed when the electrode film was examined by a microscope.

Figure 7:
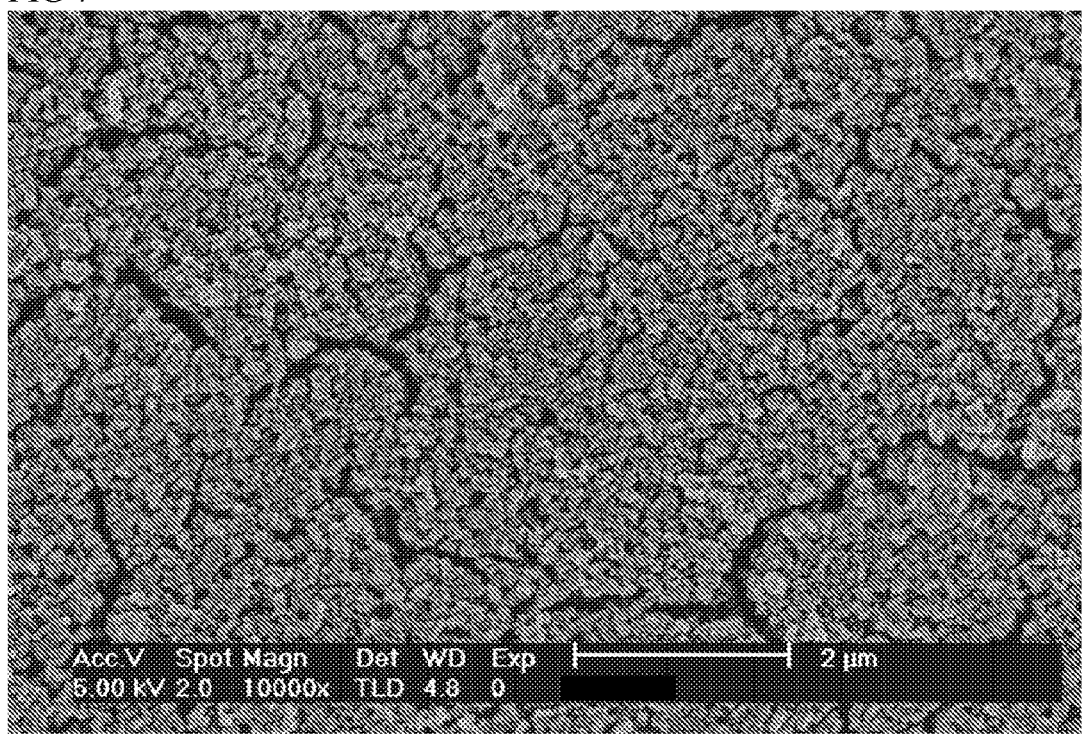
FIG. 7 shows a scanning electron microscope image of the cross section of an electrode film (Comparative Example)
Figure 8:
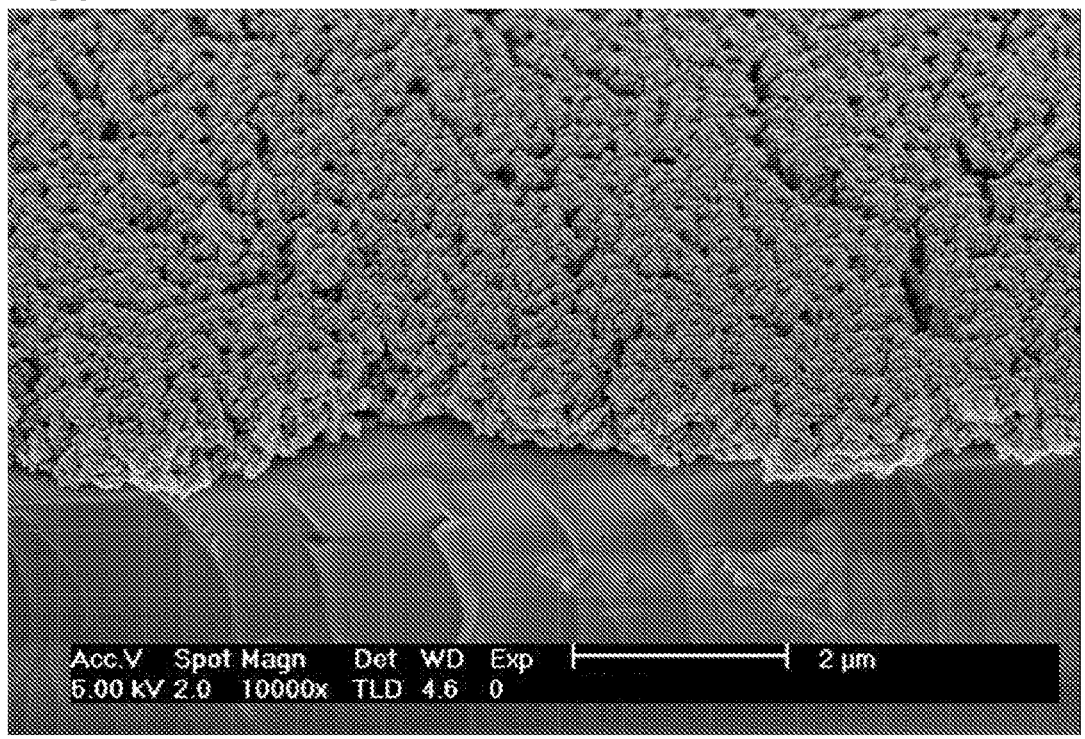
FIG. 8 shows a scanning electron microscope image of the cross section of an electrode film (Comparative Example).

Observation of Cross Section of Electrode Film:

In the observation of states on electrode film prepared as described above by a scanning electron microscope (FE-SEM, manufactured by FEI COMPANY), as shown in a plane observation image shown in FIG. 7, and a cross section observation image shown in FIG. 8, which should be compared with FIGS. 3 to 6, a good film having excellent filling property was not obtained.

Comparison on Examples with Comparative Example

Comparing comparative example with each of the above examples, the measured values of the film resistance of each of examples show a resistance values of some $10^{-4}$ Ohm·cm. In contrast, the comparative example shows a resistance value of some $10^{-3}$ Ohm·cm. Therefore, it is obvious that the electrode film formed by using the conductive ink containing the metal salt as the film density improver has a lower conductor resistance than that of the conductive ink without film density improver of comparative example.

The observation on the surface or cross section of the electrode film makes the generated difference of conductor resistance in the electrode films clear. Also it is clear in the scanning electron microscope observations, it can be understood that the cracks are confirmed in the electrode film of comparative example and shows poor filling property when compared with the electrode film of each of Examples, and is not a dense film. The observed state shows the function of the film density improver achieving in the conductive ink visually

INDUSTRIAL APPLICABILITY

Since the conductive ink according to the present invention increases the film density of the conductor formed by using the conductive ink with low resistance, so it enables the formation of the circuit having lower power consumption. Also, the conductor has excellent adhesion to the various substrates or the like. Therefore, when the metal powder contained in the conductive ink according to the present invention has fine particles and excellent in dispersion, the conductive ink is suitable for the application or the like to form the fine wiring and electrode on the substrate using an inkjet method and a dispenser method.

In addition, by suitably using additive agents such as the adhesion improver, the adhesion of the conductive ink according to the present invention to the various substrates can be adjusted, and the conductive ink enables the formation of the fine wiring and electrode. For example, the conductive ink enables the formation of the circuit on the glass substrate, or on the circuit formed by using silver or copper, or formation of wiring, electrode, protection circuit and protection film or the like on a transparent electrode using an ITO. Therefore, the conductive ink is useful in the manufacturing process of a liquid crystal display or the like.

The invention claimed is:

1. A conductive ink, comprising nickel powder, at least one film density improver, at least one solvent, at least one dispersion auxiliary agent, at least one adhesion improver, and at least one surface tension-adjusting agent, wherein
    the nickel powder has an average primary particle size in the range of 10 nm to 70 nm;
    a standard deviation of the average primary particle size is less than a quotient of the average primary particle size (nm)/2.5;
    the conductive ink has a viscosity of 60 cP or less at 25° C. and a surface tension in a range of 20 mN/m to 40 mN/m;
    the at least one film density improver is selected from a nickel salt, tungstic acid, copper acetate, and molybdic acid;
    the at least one solvent is selected from water, alcohols, glycols and saturated hydrocarbons having a boiling point of 300° C. or less at normal pressure, whereby the alcohols and glycols are not identical with the surface tension adjusting agent;
    the at least one dispersion auxiliary agent is selected from polyacrylic acids or salts thereof, polyacrylic esters, organic group-substituted ammonium hydroxides, and hydroxyl group-containing amine compounds;
    the at least one adhesion improver is selected from silane coupling agents, titanium coupling agents, zirconia coupling agents and aluminum coupling agents;
    the at least one surface tension adjusting agent is selected from alcohols and glycols having a boiling point in the range of 100° C. to 300° C. at normal pressure and a surface tension of 40 mN/m or less;
    the at least one surface tension adjusting agent is added as required for adjusting the surface tension to the range of 20 mN/m to 40 mN/m; and
    a specific resistance of a formed conductor is in a range of $2.5 \times 10^{-4}$ Ohm cm to $5.92 \times 10^{-4}$ Ohm cm.

\* \* \* \* \*